United States Patent
Oda et al.

(10) Patent No.: US 11,069,856 B2
(45) Date of Patent: Jul. 20, 2021

(54) SOLUTION FOR ORGANIC EL, METHOD OF PRODUCING ORGANIC EL DEVICE AND ORGANIC EL DEVICE

(71) Applicant: JOLED Inc., Tokyo (JP)

(72) Inventors: Tomohiko Oda, Tokyo (JP); Shinichiro Ishino, Tokyo (JP); Koyo Sakamoto, Tokyo (JP); Yasuhiro Yamauchi, Tokyo (JP)

(73) Assignee: JOLED INC., Tokyo (JP)

( * ) Notice: Subject to any disclaimer, the term of this patent is extended or adjusted under 35 U.S.C. 154(b) by 163 days.

(21) Appl. No.: 15/696,549

(22) Filed: Sep. 6, 2017

(65) Prior Publication Data

US 2018/0069178 A1 Mar. 8, 2018

(30) Foreign Application Priority Data

Sep. 7, 2016 (JP) .............................. JP2016-174808
Sep. 1, 2017 (JP) .............................. JP2017-168695

(51) Int. Cl.
*H01L 51/50* (2006.01)
*H01L 51/00* (2006.01)
(Continued)

(52) U.S. Cl.
CPC .......... *H01L 51/0007* (2013.01); *C09K 11/02* (2013.01); *C09K 11/06* (2013.01);
(Continued)

(58) Field of Classification Search
None
See application file for complete search history.

(56) References Cited

U.S. PATENT DOCUMENTS

| 8,007,590 B2 | 8/2011 | Lang et al. |
| 2006/0145167 A1 | 7/2006 | Macpherson et al. |

(Continued)

FOREIGN PATENT DOCUMENTS

| JP | 2003-308969 A | 10/2003 |
| JP | 2008-159565 A | 7/2008 |

(Continued)

OTHER PUBLICATIONS

Hansen, C. H., "Hansen Solubility Parameters: A User's Handbook", Second Edition, Jun. 15, 2007, pp. 1-26.

*Primary Examiner* — Gregory D Clark
(74) *Attorney, Agent, or Firm* — Xsensus LLP

(57) ABSTRACT

According to one embodiment, a solution for organic EL contains a mixed solvent of two or more kinds of organic solvents which contain at least a first organic solvent and a second organic solvent, and an organic EL contributing material dissolved into the mixed solvent. The coordinates (HSP coordinates) specified by Hansen solubility parameters of the first organic solvent are Hd in a range of 17.5 to 19.5 $(J/cm^3)^{1/2}$, Hp in a range of 3.5 to 5.5 $(J/cm^3)^{1/2}$ and Hh in a range of 3.5 to 5.5 $(J/cm^3)^{1/2}$. The HSP coordinates of the second organic solvent are Hd in a range of 17.5 to 19.5 $(J/cm^3)^{1/2}$, Hp in a range of 0 to 2.0 $(J/cm^3)^{1/2}$, and Hh in a range of 0.5 to 2.5 $(J/cm^3)^{1/2}$.

8 Claims, 3 Drawing Sheets

(51) Int. Cl.
 *C09K 11/06* (2006.01)
 *C09K 11/02* (2006.01)
 *H01L 27/32* (2006.01)

(52) U.S. Cl.
 CPC ........ *H01L 51/005* (2013.01); *H01L 51/0052* (2013.01); *C09K 2211/1011* (2013.01); *H01L 27/3211* (2013.01)

(56) References Cited

U.S. PATENT DOCUMENTS

| | | |
|---|---|---|
| 2009/0284134 A1* | 11/2009 | Iida ..................... C07D 209/86 |
| | | 313/504 |
| 2011/0204345 A1 | 8/2011 | Kakimoto |
| 2012/0273736 A1 | 11/2012 | James et al. |
| 2013/0062581 A1 | 3/2013 | May et al. |
| 2013/0256603 A1 | 10/2013 | Chesterfield et al. |
| 2017/0069694 A1* | 3/2017 | Ajiki .................. H01L 27/3246 |
| 2018/0016492 A1 | 1/2018 | Kakimoto |

FOREIGN PATENT DOCUMENTS

| | | |
|---|---|---|
| JP | 2009-267299 A | 11/2009 |
| JP | 2011-165661 A | 8/2011 |
| JP | 2013-516054 A | 5/2013 |
| JP | 2013-143324 A | 7/2013 |
| JP | 2014-504021 A | 2/2014 |
| JP | 2016-156016 A | 9/2016 |
| WO | 2015/018480 A1 | 2/2015 |
| WO | 2016/121498 A1 | 8/2016 |

* cited by examiner

SOLUTION FOR ORGANIC EL, METHOD OF PRODUCING ORGANIC EL DEVICE AND ORGANIC EL DEVICE

CROSS-REFERENCE TO RELATED APPLICATIONS

This application is based upon and claims the benefit of priority from Japanese Patent Applications No. 2016-174808, filed Sep. 7, 2016; and No. 2017-168695, filed Sep. 1, 2017, the entire contents of all of which are incorporated herein by reference.

FIELD

Embodiments described herein relate generally to a solution for organic EL, a method of producing an organic EL device, and an organic EL device.

BACKGROUND

In recent years, organic electroluminescence (EL) devices, which are light-emitting devices which utilize the electroluminescence phenomenon of a solid fluorescent substance are researched and developed. The organic EL devices have high visibility since they are self-luminous. Further, the organic EL devices are excellently shock-resistant since they are perfect solid state elements. An organic EL device has a structure in which an organic layer including a light-emitting layer which emits light by the electroluminescence phenomenon by recombination of carriers (holes and electrons) is stacked between an electrode pair of a pixel electrode (anode) and a common electrode (cathode). The organic layer is formed from an organic material and comprises a carrier injection layer, a carrier transport layer, a carrier-blocking layer and the like, in addition to the light-emitting layer.

Examples of the method of producing the above-described organic layer are a vapor deposition and a coating method. In the coating method, an organic material is dissolved in a solvent to prepare an ink (solution for organic EL), and the ink is applied on a substrate by a printing method (droplet discharging method) or the like. After the application, the solvent is evaporated from the ink, followed by drying, thus forming an organic layer. Thus, the coating method does not require a process to be carried out in a vacuum chamber, which is advantageous in respect of mass-production.

Here, the solution for organic EL used to manufacture organic EL devices should preferably be prepared by usually mixing two or more kinds of organic solvents in respect of the stability of discharging the droplets, the flatness of the film after dry, etc.

Incidentally, in the processing step of applying ink on a substrate by the printing method or the like, the ink is brought into contact with a structural member of the printing apparatus. Further, the ink applied on the substrate is brought into contact with other organic layers already formed on the substrate, a barrier layer (bank structure) for avoiding mixing with ink of a different color, etc.

Some of the organic solvents contained in the ink may be of such a type which elutes structural members of the printing apparatus even in a minute amount, thus degrading the device. Other organic solvents may dissolve other organic layers and barrier layers, thus deteriorating the performance of these organic layers and barrier layers. Further, some organic solvents may elute the structural members of the printing apparatus, organic layers and barrier layers even in a minute amount, thus degrading the properties of the ink itself.

SUMMARY

According to an embodiment, a solution for organic EL is provide, which does not deteriorate the properties of the solution itself even if brought into contact with a structural member of a printing apparatus.

According to another embodiment, a method of producing an organic electroluminescence device having a structure in which an organic layer including a light-emitting layer is sandwiched between two sheets of electrodes, is provided, which comprises a step of forming the organic layer by applying the solution for organic EL, followed by drying.

According to still another embodiment, an organic EL device is provided, in which the above-described organic layer is formed by the above-described production method.

According to still another embodiment, a solution for organic EL, in which an organic EL contributing material is dissolved into a mixed solvent of two or more kinds of organic solvents which contain at least a first organic solvent and a second organic solvent, is provided, wherein coordinates (HSP coordinates) specified by Hansen solubility parameters of the first organic solvent are Hd in a range of 17.5 to 19.5 $(J/cm^3)^{1/2}$, Hp in a range of 3.5 to 5.5 $(J/cm^3)^{1/2}$ and Hh in a range of 3.5 to 5.5 $(J/cm^3)^{1/2}$, and HSP coordinates of the second organic solvent are Hd in a range of 17.5 to 19.5 $(J/cm^3)^{1/2}$, Hp in a range of 0 to 2.0 $(J/cm^3)^{1/2}$, and Hh in a range of 0.5 to 2.5 $(J/cm^3)^{1/2}$.

DETAILED DESCRIPTION

Figure 1:
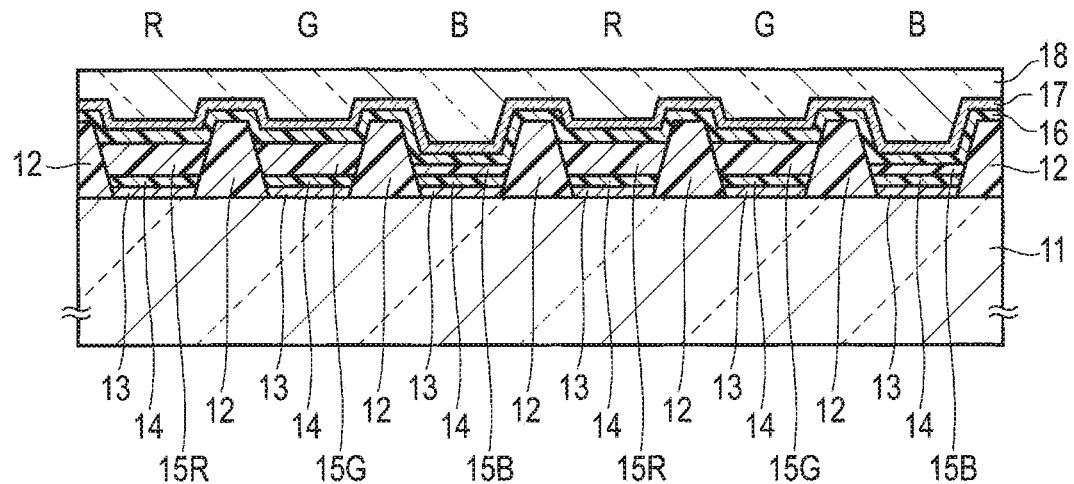
FIG. 1 is a cross section of an organic EL display panel included in an organic EL device according to an embodiment.

According to one embodiment, a solution for organic EL contains a mixed solvent of two or more kinds of organic solvents which contain at least a first organic solvent and a second organic solvent, and an organic EL contributing material dissolved into the mixed solvent. The coordinates (HSP coordinates) specified by Hansen solubility parameters of the first organic solvent are Hd in a range of 17.5 to 19.5 $(J/cm^3)^{1/2}$, Hp in a range of 3.5 to 5.5 $(J/cm^3)^{1/2}$ and Hh in a range of 3.5 to 5.5 $(J/cm^3)^{1/2}$. The HSP coordinates of the second organic solvent are Hd in a range of 17.5 to 19.5 $(J/cm^3)^{1/2}$, Hp in a range of 0 to 2.0 $(J/cm^3)^{1/2}$, and Hh in a range of 0.5 to 2.5 $(J/cm^3)^{1/2}$.

The Hansen solubility parameters (HSP) include three parameters of energy (Hd) by London dispersion force, energy (Hp) by dipole interaction and energy (Hh) by hydrogen bonding. The HSP is a vector quantity represented as (Hd, Hp, Hh) and is expressed by plotting on a three-dimensional space (Hansen space) defined by coordinate axes of the three parameters. The coordinates specified by HSP are expressed by, for example, HSP coordinates. The unit of each parameter is $(J/cm^3)^{1/2}$. The HSP is discussed in, for example, Hansen Solubility Parameters: A User's Handbook, Second Edition, by Charles M. Hansen, pages 1 to 26.

The HSP of the generally available substances are compiled in a database. Therefore, by referring to the database, the HSP of a desired substance can be obtained. The HSP of a substance not registered in the database can be calculated from the chemical structure of the substance, for example, by using a computer software such as Hansen Solubility Parameters in Practice (HSPiP).

The HSP of a mixture containing two or more substances is computed as a vectorial sum of the values obtained by multiplying the HSP of each substance by the volume ratio of the respective substance to the entire mixture.

The HSP coordinates of the first organic solvent according to the embodiment are Hd in a range of 17.5 to 19.5 $(J/cm^3)^{1/2}$, Hp in a range of 3.5 to 5.5 $(J/cm^3)^{1/2}$ and Hh in a range of 3.5 to 5.5 $(J/cm^3)^{1/2}$.

Examples of the first organic solvent include ethyl phenylacetate, m-tolyl acetate, o-tolyl acetate, o-methylbenzyl acetate, propyl phenylacetate, propyl 2-phenylacetate, styralyl acetate, methyl phenylacetate, methylphenyl carbinyl acetate, methylbenzyl acetate, propyl 3-phenylacetate, allyl phenylacetate, benzyl butyrate, o-cresyl isobutyrate, cresyl butyrate, p-cresyl isobutyrate, p-anisyl isobutyrate, methyl 4-phenylbutyrate, benzyl propionate, phenethyl propionate, styralyl propionate, cinnamyl propionate, p-cresyl propionate, p-methylanisole, m-methylanisole, o-methylanisole, 2,4-dimethylanisole, o-vinylanisole, 4-ethylanisole, phenylacetaldehyde ethylene acetal, benzaldehyde propylene acetal, 2-(α-methylbenzyl)-1,3-dioxolane, cinnamaldehyde dimethyl acetal, o-diethoxybenzene, p-methoxystyrene, 2-ethoxynaphthalene, 4-allylanisole, 3,4-dimethoxystyrene, 1-ethoxynaphthalene, octyl methoxycinnamate, 2,5-dimethoxystyrene, 2,6-dimethoxystyrene, 1-methoxy-4-propoxybenzene, benzyl methyl ether, butyl phenyl ether, ethyl phenyl ether, benzyl ethyl ether, phenyl isopropyl ether, phenyl propyl ether, allyl phenyl ether, phenyl vinyl ether, anethole, dihydroanethole, benzalacetone, phenyl ethylidene acetone, 2-(4-isopropylphenyl)propanal and 3-(4-isopropylphenyl)propanal. As long as the HSP is within the above-described ranges, the first organic solvent may be a solvent mixture of two or more kinds.

The first organic solvent according to the embodiment should preferably be dimethylanisole.

The HSP coordinates of the second organic solvent according to the embodiment are Hd in a range of 17.5 to 19.5 $(J/cm^3)^{1/2}$, Hp in a range of 0 to 2.0 $(J/cm^3)^{1/2}$, and Hh in a range of 0.5 to 2.5 $(J/cm^3)^{1/2}$.

Examples of the second organic solvent include mesitylene, cyclohexylbenzene, toluene, benzene, p-diethylbenzene, ethylbenzene, o-n-butyltoluene, 1,2-diethylbenzene, 1,2,3,4-tetramethylbenzene, 1,2,3,5-tetramethylbenzene, 1,1-diphenylpentane, 1,1-diphenylhexane, 3-(1-methylethenyl)toluene, 1-methyl-3-propylbenzene, 1-methyl-4-(1-methylethyl)-2-(1-propenyl)benzene, pentamethylbenzene, isopropylbenzene, 1,2,4-trimethylbenzene, 2,2-diphenylpropane, 2-ethyldiphenylmethane, 1,4-dimethyltetraline, calamenene, 1-butyl-1,2,3,4-tetrahydronaphthalene, 3-ethyldiphenylmethane, 1,1-diphenylpropane, 3-ethylbiphenyl, 3-methyldiphenylmethane, 1,1-diphenylbutane, 3,3'-dimethylbiphenyl, 3,3',4,4'-tetramethylbiphenyl, 3,3',5,5'-tetramethylbiphenyl, diethylbiphenyl, (S)-1,2-dihydro-4,7-dimethyl-1-isopropylnaphthalene and (S)-1,2-dihydro-1,6-dimethyl-4-isopropylnaphthalene. As long as the HSP is within the above-described ranges, the first organic solvent may be a solvent mixture of two or more kinds.

The second organic solvent according to the embodiment should preferably be diphenylpropane.

The solution for organic EL according to the embodiment may contain, in addition to the first organic solvent and the second organic solvent, some other solvent as needed within the scope in which the object of the embodiments is not inhibited.

The organic EL contributing material is an organic material contributing to organic EL, and contains an organic EL material (a light-emitting material of R, G or B), a carrier transport material (an electron transport material or a hole transport material), carrier injection material (an electron injection material or a hole injection material) or a carrier blocking material (an electron blocking material or a hole blocking material).

The organic EL contributing material according to the embodiment is, for example, one of a light-emitting material, a carrier transport material, a carrier injection material and a carrier blocking material.

Examples of the light-emitting material include such fluorescent materials as F8-co-F6 (copolymer of F8 (polydioctylfluorene) and F6 (polydihexylfluorene)), an oxinoid compound, a perylene compound, a pyrrolopyrrole compound, a naphthalene compound, an anthracene compound, a fluorene compound, a fluoranthene compound, a tetracene compound, a pyrene compound, a coronene compound, a quinolone compound, an azaquinolone compound, a pyrazoline derivative, a pyrazolone derivative, a rhodamine compound, a chrysene compound, a phenanthrene compound, a cyclopentadiene compound, a stilbene compound, a diphenylquinone compound, a styryl compound, a butadiene compound, a dicyanomethylenepyran compound, a dicyanomethylenethiopyran compound, a fluorescein compound, a pyrylium compound, a thiapyrylium compound, a selenapyrylium compound, a telluropyrylium compound, an aromatic aldadiene compound, an oligophenylene compound, a thioxanthene compound, a cyanine compound, an acridine compound, a metal complex of 8-hydroxyquinoline compound, a metal complex of 2-bipyridine compound, a complex of a Schiff base and a group III metal, an oxine metal complex and a rare earth complex. These compounds and complexes may be used solely, or in any combination thereof.

Examples of the hole transport material include a triazole derivative, an oxadiazole derivative, an imidazole derivative, a polyarylalkane derivative, a pyrazoline derivative, a pyrazolone derivative, a phenylenediamine derivative, an arylamine derivative, an amino-substituted chalcone derivative, an oxazole derivative, a styrylanthracene derivative, a fluorenone derivative, a hydrazone derivative, a stilbene derivative, a porphyrin compound, an aromatic tertiary amine compound, a styrylamine compound, a butadiene compound, a polystyrene derivative, a triphenylmethane derivative and a tetraphenylbenzine derivative. These compounds and complexes may be used solely or in any combination thereof. Further, the hole transport material may be used as an electron blocking material.

Examples of the electron transport material include a phenanthroline derivative, a pyridine derivative, a tetrazine derivative, a compound containing a heterocycle such as an oxadiazole derivative and a metal complex such as a tris (8-hydroxyquinolinato) aluminium complex ($Alq_3$). These compounds and complexes may be used solely or in any combination thereof. Further, the electron transport material may be used as a hole blocking material.

Examples of the hole injection material include metal oxides such as MoOx (molybdenum oxide), WOx (tungsten oxide) and MoxWyOz (molybdenum-tungsten oxide) (where x, y and z are positive numbers), a metal nitride and a metal oxynitride.

Examples of the electron injection material include alkali metals such as lithium and sodium, alkaline earth metals such as calcium and magnesium, inorganic compounds of alkali metals or alkaline earth metals, such as lithium fluoride and lithium oxide, an organometallic complex containing an alkali metal or an alkaline earth metal as a central metal and such as 8-hydroxyquinolinolato-lithium.

The solution for organic EL according to the embodiment does not deteriorate the properties of the solution itself even if brought into contact with a structural member of a printing apparatus. More specifically, even if brought into contact with a structural member of a printing apparatus, the organic EL contributing material contained in the solution for organic EL itself does not deteriorate in properties. Moreover, the solution for organic EL does not dissolve and degrade other organic layers already formed on the substrate even if brought into contact with these, or does not deteriorate the properties of the solution itself, either. Therefore, organic layers can be formed without degrading their properties by using the solution for organic EL according to the embodiment, applying the solution on a substrate with a droplet discharging method or the like, followed by drying.

According to one embodiment, there is provided a method of producing an organic EL device having a structure in which an organic layer containing a light-emitting layer is sandwiched between two sheets of electrodes, and the method comprises forming the forming the organic layer by applying the solution for organic EL according to the embodiment, followed by drying.

A method of manufacturing an organic EL device according to an embodiment will be described hereafter. First, with reference to FIG. 1, the structure of an organic EL display panel 1 produced by the manufacturing method will be described. Note that the organic EL display panel 1 is built into the organic EL device according to the embodiment.

FIG. 1 is a cross section of the organic EL display panel 1. FIG. 1 shows two pixels (six sub-pixels) of the organic EL display panel 1.

The organic EL display panel 1 comprises a TFT substrate 11 containing a glass substrate, a thin film transistor (TFT) layer, a planarized film, etc., and barrier layers 12 formed on the TFT substrate 11. Conventionally-known thin film transistor and planarized film are used here, and therefore the structures thereof are not illustrated. The barrier layers 12 are each formed to have a thickness of about 1 μm and the cross sections thereof has a forward tapered shape.

In each of sub-pixel regions between adjacent pairs of the barrier layers 12, an anode (a first electrode) 13 formed of a metal such as Al, a hole injection layer 14 and light-emitting layers 15R, 15G, and 15B made from light-emitting materials (hereafter, when there is no necessity for distinction, it will be generally referred to as "a light-emitting layer 15") are stacked one on another. Further, an electron injection layer 16 which covers the barrier layer 12 and the light-emitting layer 15, a cathode (a second electrode) 17 formed from a transparent material such as indium tin oxide (ITO) and a sealing layer 18 formed from a light-transmissive material such as SiN or SiON are stacked in order. In the organic EL display panel 1, a combination of three sub-pixels, R, G and B form one pixel. Note that different colors R, G, and B emitted from the sub-pixel regions are due to different light-emitting materials of the light-emitting layer 15, respectively.

Next, the method of producing the organic EL display panel 1 will be described with reference to FIGS. 2A, 2B, 2C, 2D and FIG. 3.

Figure 2A:
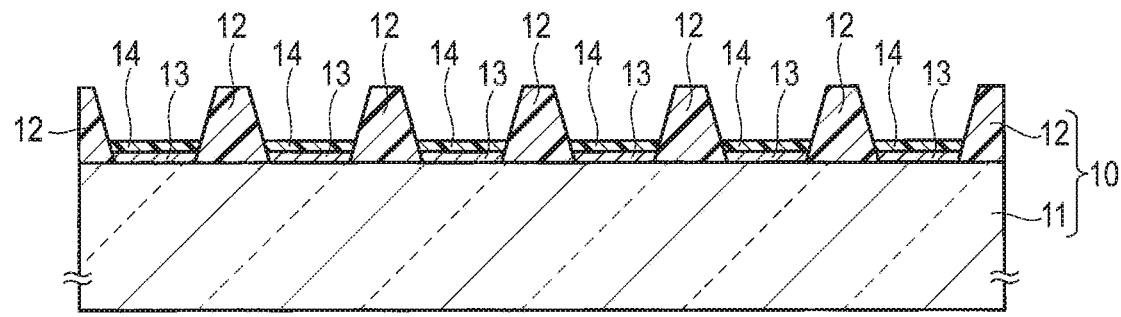
FIGS. 2A, 2B, 2C, and 2D are cross sections illustrating processing steps for manufacturing the organic EL display panel shown in FIG. 1.
Figure 2B:
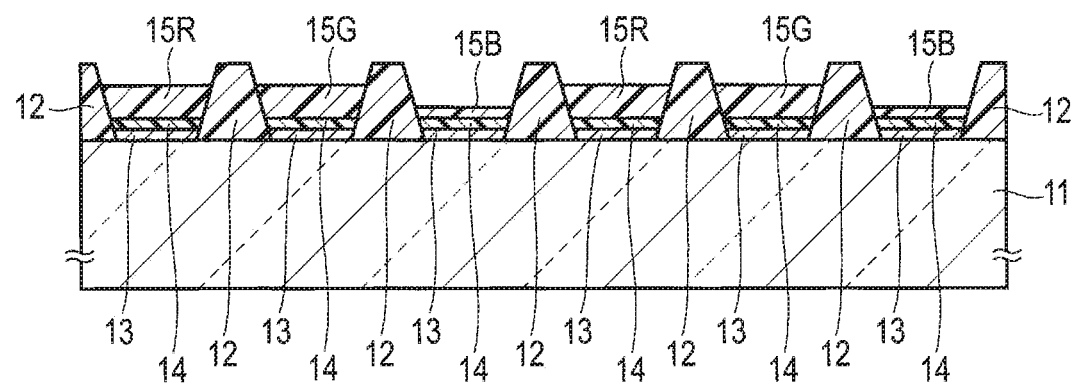
Figure 2C:
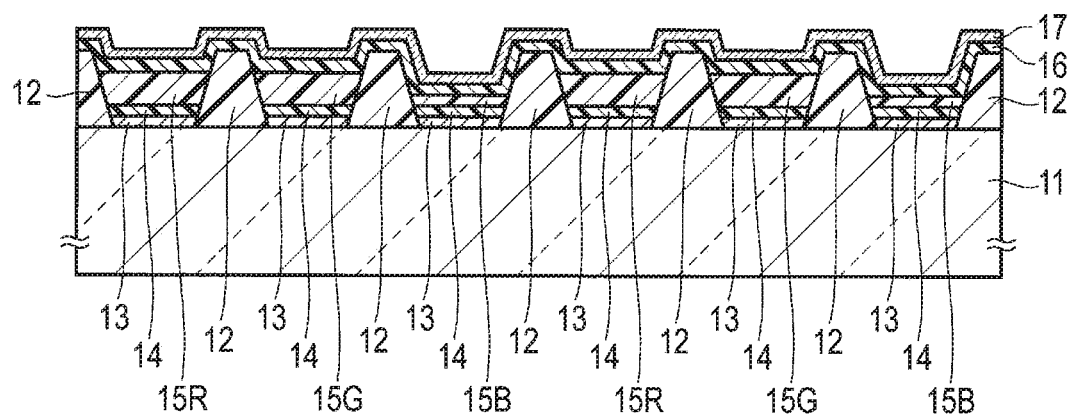
Figure 2D:
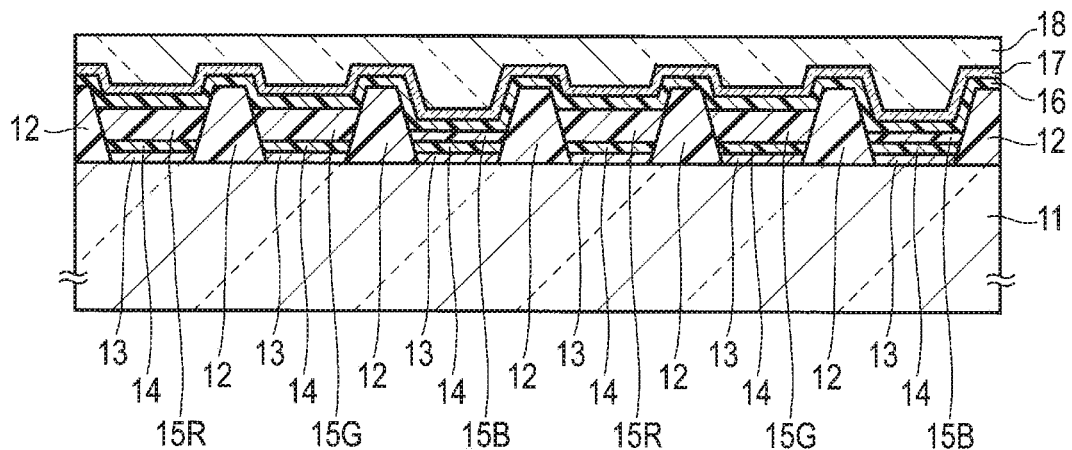
Figure 3:
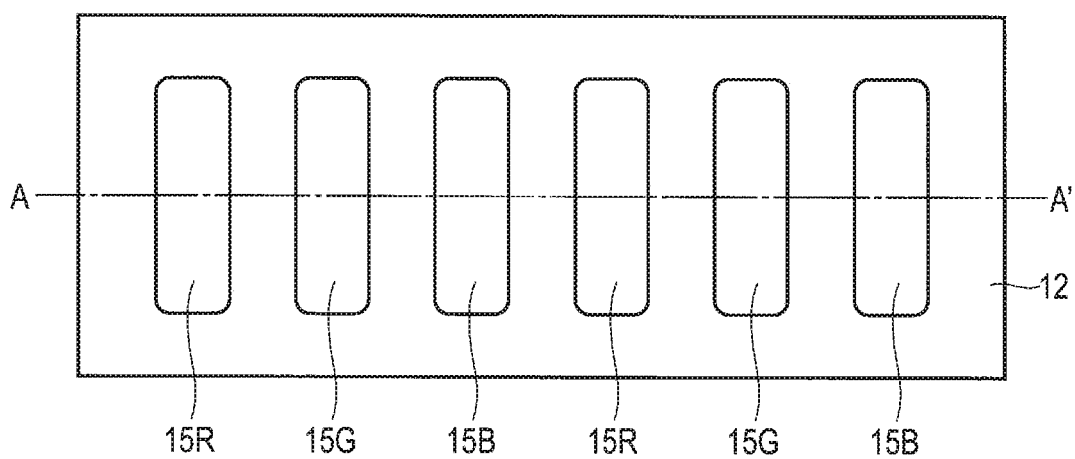
FIG. 3 is a top view of the organic EL display panel shown in FIG. 1, when manufactured.

FIGS. 2A, 2B, 2C and 2D are cross sections illustrating the manufacturing process of the organic EL display panel 1, and FIG. 3 is a top view of that shown in FIG. 2B. Note that the cross section taken along line A-A' in FIG. 3 is FIG. 2B.

First, as shown in FIG. 2A, a substrate 10 comprising a TFT substrate 11, barrier layers 12, anodes 13 and hole injection layers 14 is prepared.

Then, as shown in FIG. 2B, in recesses surrounded by the barrier layers 12 in all the sub-pixel regions on the substrate 10, the solution for organic EL, which is the material of the light-emitting layers 15, is applied by a printing method using ink jet, followed by drying, to form the respective light-emitting layers 15. As shown in FIG. 3, the light-emitting layers 15 are surrounded by the barrier layers 12. The regions where the light-emitting layers 15 are exposed are equivalent to the respective sub-pixel regions. In the case of a general 20-inch organic EL display panel, where 1280× 768 pixels are disposed at an equal distance, the size of the sub-pixel region is about 64 μm×234 μm.

As shown in FIG. 2C, the electron injection layer 16 and the cathode 17 are formed to cover the barrier layers 12 and the light-emitting layer 15.

Then, as shown in FIG. 2D, the sealing layer 18 is formed on the cathode 17 and thus the organic EL display panel 1 is completed.

The cathode 17 and the sealing layer 18 are formed from general members by a forming method in the conventionally-known organic EL device technology.

Next, with reference to FIG. 4, the structure of the organic EL device 40 according to the embodiment will be described.

Figure 4:
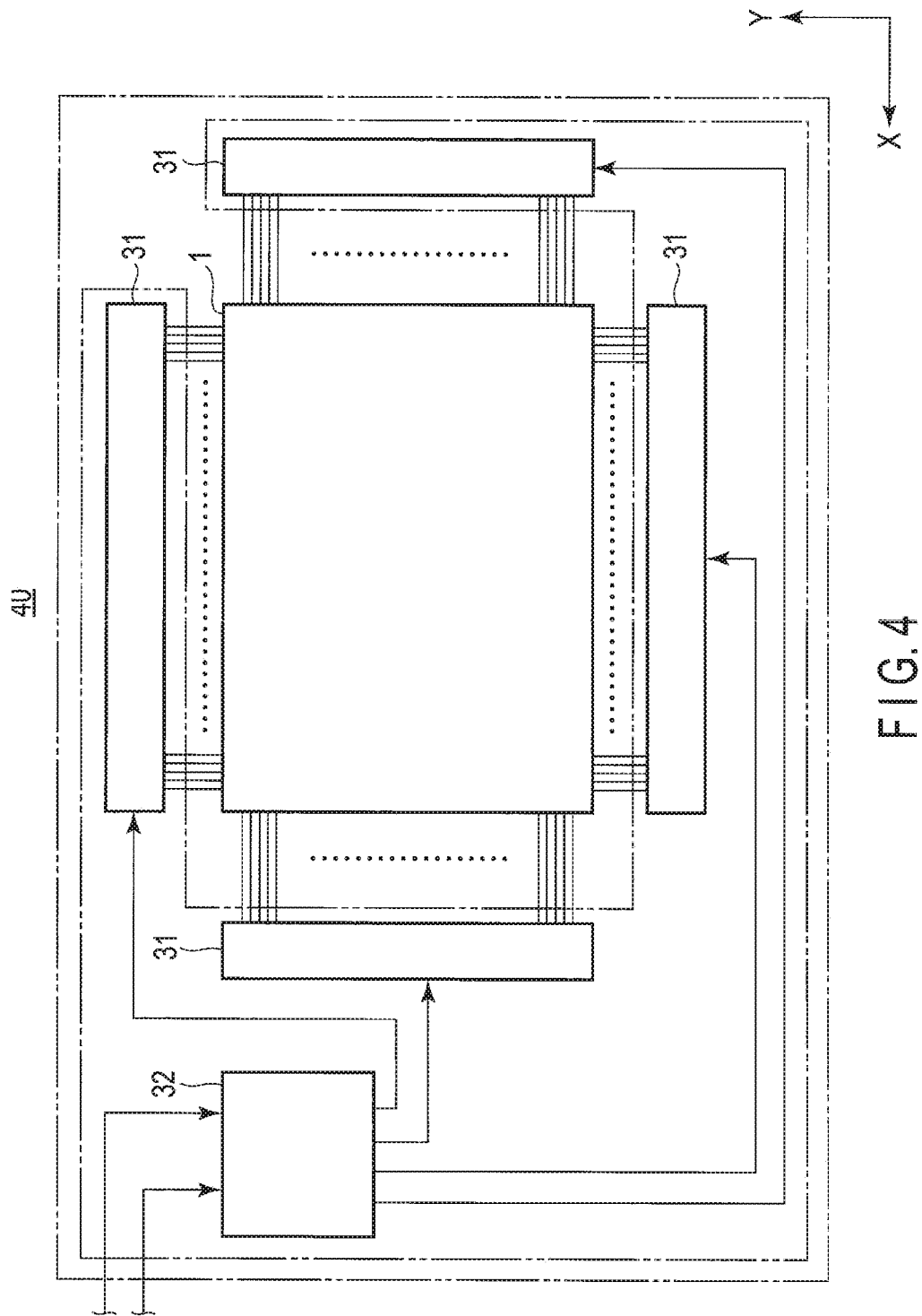
FIG. 4 is a schematic block diagram showing a brief structure of the organic EL device comprising the organic EL display panel shown in FIG. 1.

FIG. 4 is a schematic block diagram showing a brief structure of the organic EL device 40 comprising the organic EL display panel 1.

As shown in FIG. 4, the organic EL display panel 1 is electrically connected to a drive circuit 31. The drive circuit 31 is controlled by a control circuit 32. The organic EL display panel 1 is electrically connected by a conventionally known way. Thus, the organic EL device 40 comprising the organic EL display panel 1 can be manufactured. In other words, the organic layer of the organic EL device is formed by the production method described above.

Examples

The embodiment will now be described by way of examples.

[Preparation of Organic Solvent]

Organic solvents A to F indicated in Table 1 were prepared. The HSP coordinates of the organic solvents are also indicated.

TABLE 1

| | | | HSP | | |
|---|---|---|---|---|---|
| | | Organic solvents | Hd | Hp | Hh |
| First organic solvents | A | 2,4-dimethylanisole | 18.1 | 4.2 | 4.2 |
| | B | benzyl butyrate | 17.5 | 3.7 | 4.9 |

TABLE 1-continued

| | | Organic solvents | HSP | | |
|---|---|---|---|---|---|
| | | | Hd | Hp | Hh |
| Second organic solvents | C | 2,2-diphenylpropane | 18.2 | 1.2 | 1.8 |
| | D | mesitylene | 18.0 | 0.6 | 0.6 |
| Other organic solvents | E | cyclohexane | 17.8 | 8.4 | 5.1 |
| | F | N-methyl-2-pyrrolidone | 18.0 | 12.3 | 7.2 |

[Preparation of Organic EL Contributing Material (Solute)]

An anthracene-based light-emitting material was prepared as a solute.

[Preparation of Solution for Organic EL]

For each example, each of the solvent mixtures of the combinations listed in Table 2 and the solute were agitated in a shaker at rotation of 100 rpm for 24 hours under the atmospheric air at a temperature of 60° C., dissolving the solute, and thus 2.0% by weight of solutions for organic EL (No. 1 to No. 13) were prepared. Note that the mixed ratio of between the two types of organic solvents was set to 50:50 (ratio in % by weight).

[Evaluation Method]

The solutions for organic EL, thus prepared, No. 1 to No. 13, were each set in respective printing apparatuses, and discharged therefrom. In this manner, solutions brought into contact with a structural member of the printing apparatus and those which were not, were prepared. Then, after a deaeration treatment, the photoluminescence quantum efficiency (PLQE) of each solution for organic EL was measured with a photoluminescence quantum efficiency measuring device.

Next, the PLQE variation rate (%) of each solution for organic EL (No. 1 to No. 13) was calculated from for the following formula:

[PLQE variation rate]=([PLQE of solution for organic EL, brought into contact with a structural member of the printing apparatus]/[PLQE of solution for organic EL, not brought into contact therewith])×100%.

The PLQE variation rates of the solutions for organic EL (No. 1 to No. 13) were evaluated by three steps of results: a, b and c. Evaluation a means that the PLQE variation rate was 90% or higher and the properties of the solution for organic EL was not deteriorated or if deteriorated, the degree of deterioration was low. Evaluation b means that the PLQE variation rate was 60% or higher and less than 90%. Evaluation c means that the PLQE variation rate was less than 60% and the degree of deterioration of the solution for organic EL was high. The results are shown in Table 2.

TABLE 2

| | Combination of solvents | | PLQE variation | |
|---|---|---|---|---|
| No. | 1 | 2 | rate (%) | Evaluation |
| 1 | A | C | 102.5 | a |
| 2 | | D | 105.1 | a |
| 3 | | E | 59.4 | c |
| 4 | | F | 80.6 | b |
| 5 | B | C | 101.2 | a |
| 6 | | D | 108.0 | a |
| 7 | | E | 40.7 | c |
| 8 | | F | 61.3 | b |
| 9 | C | E | 66.1 | b |
| 10 | | F | 30.1 | c |
| 11 | D | E | 66.1 | b |
| 12 | | F | 30.1 | c |
| 13 | E | F | 57.6 | c |

[Result]

As shown in Table 2, each solution for the organic EL (No. 1, 2, 5 and 6) which contained solvent mixtures of the first organic solvent and the second organic solvent, exhibited a PLQE variation rate of over 100%. In other words, it is understood that even if the solutions for organic EL according to the embodiments are is brought into contact with the structural member of the printing apparatus, the properties of the solution itself are not deteriorated.

Further, those solutions for organic EL which contains only one of the first organic solvent and the second organic solvent or does not contain either of them, each exhibited a PLQE variation rate of less than 100%. As a comparative example, when organic solvents E and F, which does not satisfy the HSPs of the first organic solvent and the second organic solvents, were used, the PLQE variation rate was lower in such cases.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An organic EL ink suitable for a printing apparatus, comprising:
   a mixed solvent of two or more kinds of organic solvents which contain at least a first organic solvent and a second organic solvent; and
   an organic EL contributing material dissolved into the mixed solvent,
   wherein the first organic solvent comprises benzyl butyrate, wherein HSP coordinates of the second organic solvent are Hd in a range of 17.5 to 19.5 $(J/cm3)^{1/2}$, Hp in a range of 0 to 2.0 $(J/cm3)^{1/2}$, and Hh in a range of 0.5 to 2.5 $(J/cm3)^{1/2}$, and
   wherein the second organic solvent comprises mesitylene, cyclohexylbenzene, toluene, benzene, p-diethylbenzene, ethylbenzene, o-n-butyltoluene, 1,2-diethylbenzene, 1,2,3,4-tetramethylbenzene, 1,2,3,5-tetramethylbenzene, 1,1-diphenylpentane, 1,1-diphenylhexane, 3-(1-methylethenyl)toluene, 1-methyl-3-propylbenzene, 1-methyl-4-methylethyl)-2-(1-propenyl)benzene, pentamethylbenzene, isopropylbenzene, 1,2,4-trimethylbenzene, 2,2-diphenylpropane, 2-ethyldiphenylmethane, 1,4-dimethyltetraline, calamenene, 1-butyl-1,2,3,4-tetrahydronaphthalene, 3-ethyldiphenylmethane, 1,1-diphenylpropane, 3-ethylbiphenyl, 3-methyldiphenylmethane, 1,1-diphenylbutane, 3,3'-dimethylbiphenyl, 3,3',4,4'-tetramethylbiphenyl, 3,3',5, 5'-tetramethylbiphenyl, diethylbiphenyl, (S)-1,2-dihydro-4,7-dimethyl-1-isopropylnaphthalene, and/or (S)-1,2-dihydro-1,6-dimethyl-4-isopropylnaphthalene.

2. The organic EL ink claim 1, wherein the organic EL contributing material is one of a light-emitting material, a carrier transport material, a carrier injection material and a carrier blocking material.

3. The organic EL ink of claim 1, wherein the organic EL contributing material comprises an anthracene-based light-emitting material.

4. A method of manufacturing an organic EL device comprising a structure in which an organic layer containing a light-omitting layer is sandwiched between two sheets of electrodes; the method comprising:
applying the organic EL ink of claim 1; and
drying the solution, thereby forming the organic layer.

5. The organic EL ink suitable for a printing apparatus, comprising:
a mixed solvent of two or more kinds of organic solvents which contain at least a first organic solvent and a second organic solvent; and
an organic EL contributing material dissolved into the mixed solvent,
wherein HSP coordinates of the first organic solvent are Hd in a range of 17.5 to 19.5 $(J/cm3)^{1/2}$, Hp in a range of 3.5 to 5.5 $(J/cm3)^{1/2}$ and Hh in a range of 3.5 to 5.5 $(J/cm3)^{1/2}$,
wherein the first organic solvent comprises ethyl phenylacetate, m-tolyl acetate, o-tolyl acetate, o-methylbenzyl acetate, propyl phenylacetate, propyl 2-phenylacetate, styralyl acetate, methyl phenylacetate, methylphenyl carbonyl acetate, methylbenzyl acetate, propyl 3-phenylacetate, allyl phenylacetate, benzyl butyrate, o-cresyl isobutyrate, cresyl butyrate, p-cresyl isobutyrate, p-anisyl isobutyrate, methyl 4-phenylbutyrate, benzyl propionate, phenethyl propionate, styralyl propionate, cinnamyl propionate, p-cresyl propionate, p-methylanisole, m-methylanisole, o-methylanisole, 2,4-dimethylanisole, o-vinylanisole, 4-ethylanisole, phenylacetaldehyde ethylene acetal, benzaldehyde propylene acetal, 2-(a-methylbenzyl)-1, 3-dioxolane, cinnamaldehyde dimethyl acetal, o-diethoxybenzene, p-methoxystyrene 2-ethoxynaphthalene, 4-allylanisole, 3,4-dimethoxystyrene, 1-ethoxynaphthalene, octyl methoxycinnamate, 2,5-dimethoxystyrene, 2,6-dimethoxystyrene, 1-methoxy-4-propoxybenzene, benzyl methylether, butyl phenyl ether, ethyl phenyl ether, benzyl ethyl ether, phenyl isopropyl ether, phenyl propyl ether, allyl phenyl ether phenylvinyl ether, anethole, dihydroanethole, benzalacetone, phenyl ethylidene acetone, 2-(4-isopropylphenyl)propanal, and/or 3-(4-isopropylphenyl)propanal, and
wherein the second organic solvent comprises diphenylpropane.

6. The organic EL ink claim 5, wherein the organic EL contributing material is one of a light-emitting material, a carrier transport material, a carrier injection material and a carrier blocking material.

7. The organic EL ink of claim 5, wherein the organic EL contributing material comprises an anthracene-based light-emitting material.

8. A method of manufacturing an organic EL device comprising a structure in which an organic layer containing a light-emitting layer is sandwiched between two sheets of electrodes; the method comprising:
applying the organic EL ink of claim 5; and
drying the solution, thereby forming the organic layer.

* * * * *